United States Patent
Suk et al.

(10) Patent No.: US 11,844,294 B2
(45) Date of Patent: Dec. 12, 2023

(54) RESISTANCE ACCESS MEMORY DEVICE AND FABRICATING METHOD OF THE SAME

(71) Applicant: RESEARCH & BUSINESS FOUNDATION SUNGKYUNKWAN UNIVERSITY, Suwon-si (KR)

(72) Inventors: Jung Hyun Suk, Seoul (KR); Han Gil Sang, Suwon-si (KR); SangMyeong Lee, Gimhae-si (KR); Won Bin Kim, Suwon-si (KR); Jae Myeong Lee, Gwanghyewon-myeon (KR); Jun Young Kim, Suwon-si (KR); Oh Young Gong, Suwon-si (KR); Jin Hyuk Choi, Suwon-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 265 days.

(21) Appl. No.: 17/401,533

(22) Filed: Aug. 13, 2021

(65) Prior Publication Data
US 2022/0085289 A1    Mar. 17, 2022

(30) Foreign Application Priority Data
Sep. 14, 2020   (KR) .................. 10-2020-0117695

(51) Int. Cl.
*H10B 63/00*    (2023.01)
*H10N 70/20*    (2023.01)
*H10N 70/00*    (2023.01)

(52) U.S. Cl.
CPC .......... *H10N 70/882* (2023.02); *H10B 63/82* (2023.02); *H10N 70/021* (2023.02); *H10N 70/24* (2023.02); *H10N 70/821* (2023.02); *H10N 70/841* (2023.02); *H10N 70/884* (2023.02); *H10N 70/8822* (2023.02); *H10N 70/8825* (2023.02);
(Continued)

(58) Field of Classification Search
CPC ...... H10B 63/82; H10N 70/24; H10N 70/841; H10N 70/882; H10N 70/8822; H10N 70/8825
See application file for complete search history.

(56) References Cited

U.S. PATENT DOCUMENTS

| | | | |
|---|---|---|---|
| 2012/0091423 A1* | 4/2012 | Sumino | H10N 70/8836 257/E47.001 |
| 2013/0221310 A1* | 8/2013 | Morikawa | H10N 70/026 257/2 |

(Continued)

FOREIGN PATENT DOCUMENTS

KR    10-1828131 B1    2/2018

*Primary Examiner* — Herve-Louis Y Assouman
*Assistant Examiner* — Christopher M Roland
(74) *Attorney, Agent, or Firm* — NSIP Law (57) ABSTRACT

A resistance access memory device includes a first electrode, a resistance change layer, formed on the first electrode, comprising a thin film containing $BiX^1_3$ and and $Bi_2X^2_{(3-x)}$, and a second electrode formed on the resistance change layer, where $X^1$ is a halogen element selected from the group consisting of F, Cl, Br, I, and combinations thereof, $X^2$ is a chalcogen element selected from the group consisting of S, Se, Te, and combinations thereof, and x is a real number of 0 or more and less than 3.

17 Claims, 8 Drawing Sheets

(52) U.S. Cl.
CPC ....... H10N 70/8828 (2023.02); *H10N 70/026* (2023.02)

(56) References Cited

U.S. PATENT DOCUMENTS

2019/0074439 A1* 3/2019 Banerjee .............. H10N 70/023
2020/0395540 A1* 12/2020 Lee .................... H10N 70/8833
2021/0296585 A1* 9/2021 Daibou ................. H10N 70/20

* cited by examiner

RESISTANCE ACCESS MEMORY DEVICE AND FABRICATING METHOD OF THE SAME

CROSS-REFERENCE TO RELATED APPLICATIONS

This application claims the benefit under 35 USC 119(a) of Korean Patent Application No. 10-2020-0117695 filed on Sep. 14, 2020, in the Korean Intellectual Property Office, the entire disclosure of which is incorporated herein by reference for all purposes.

BACKGROUND

1. Field

The present disclosure relates to a resistance access memory device and a fabricating method of the same.

2. Description of the Related Art

Nonvolatile memories are suitable for mobile devices such as mobile phones due to having a ROM in which input information is not deleted even when power is not supplied and a RAM in which information input/out is free. These nonvolatile memories include a resistance random access memory (RRAM), a magnetic random access memory (MRAM), a ferroelectric random access memory (FRAM), a phase-change random access memory (PRAM), etc. In particular, the resistance random access memory (RRAM) is one of the next-generation nonvolatile memory devices with significant competitiveness compared with a flash memory due to low power consumption characteristics, high speed, nonvolatility, and a simple structure.

A resistance access memory device that attracts attention as a next-generation memory device due to high density, high integration, and low power consumption has a characteristic capable of recording information according to a resistance state while increasing or decreasing an electric resistance through an electric signal. The resistance access memory device uses a simple device structure (metal/oxide/metal) and may record information by increasing or decreasing a resistance value of oxide when an appropriate voltage/current condition is applied. These two resistance states are divided by a difference of '0' and '1', and a memory device that can recognize the difference may be referred to as the resistance access memory device.

The resistance access memory device may be classified according to a resistance change mechanism. For example, a case where the resistance is changed due to a phase change may be referred to as a phase change RAM (PRAM), a case where the resistance is changed by a spin change may be referred to as a magnetic RAM (MRAM). A case where the resistance is changed by the motion of ions in a material may be referred to as a resistance RAM (RRAM).

In the resistance access memory device, a layer where the resistance is changed is referred to as a resistance change layer. Generally, an oxide is typically used as the resistance change layer. However, since the oxide-based resistance change layer should be formed in a high temperature and vacuum environment, there are problems that it is difficult to reduce manufacturing costs, it is difficult to implement a flexible memory device, and it is difficult to control the resistance change of the resistance change layer.

In order to solve the problem of the oxide-based resistance change layer, a resistance change layer using a perovskite material of $APbX_3$ (X=halogen) instead of using the oxide in the resistance change layer has been studied. A resistance access memory device using $APbX_3$ has characteristics of low voltage and high efficiency. However, since the $APbX_3$ material contains lead, there is a problem in that environmental pollution is caused.

As the background art of the present disclosure, Korean Patent Registration No. 10-1828131 relates to a resistance change memory device including organic-inorganic hybrid perovskite as a resistance change layer and a method for fabricating the same. In Korean Patent Registration No. 10-1828131, a perovskite material using lead is used as the resistance change layer, and there is no mention of a resistance change layer without using lead.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a resistance access memory device includes a first electrode, a resistance change layer, formed on the first electrode, comprising a thin film containing $BiX^1_3$ and and $Bi_2X^2_{(3-x)}$, and a second electrode formed on the resistance change layer, where $X^1$ is a halogen element selected from the group consisting of F, Cl, Br, I, and combinations thereof, $X^2$ is a chalcogen element selected from the group consisting of S, Se, Te, and combinations thereof, and x is a real number of 0 or more and less than 3.

The thin film may have a composition gradient of the $BiX^1_3$ component and the $Bi_2X^2_{(3-x)}$ component.

The thin film may include a first area where a composition ratio of $BiX^1_3$ is more than 55 at %, a second area where the composition ratio of $BiX^1$ is more than 12 at % and 55 at % or less, and a third area where the composition ratio of $BiX^1_3$ is 12 at % or less.

The first area, the second area, and the third area may be separated from each other.

A current on/off ratio of the resistance access memory device including the first area may be $10^4$ to $10^{10}$.

The resistance access memory device including the second area may be write once read many (WORM).

The resistance access memory device may further include a polymer protective layer formed on the resistance change layer.

The polymer protective layer may include a polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, polymethoxy polyethylene glycol methacrylate, poly 2-methoxyethyl glycidyl ether, and combinations thereof.

Each of the first electrode and the second electrode may include a material selected from the group consisting of Pt, Ti, Ag, Au, Ni, Zr, Ta, Zn, Nb, Cr, Co, Mn, Fe, Al, Mg, Si, W, Cu, lanthanum metals, nitrides thereof, oxides thereof, and combinations thereof.

In another general aspect, a fabricating method of a resistance access memory device includes depositing a first electrode on a substrate, depositing a resistance change layer on the substrate, and depositing a second electrode on the resistance change layer. The resistance change includes $BiX^1_3$ and and $Bi_2X^2_{(3-x)}$, wherein $X^1$ is a halogen element selected from the group consisting of F, Cl, Br, I, and combinations thereof and $X^2$ is a chalcogen element selected from the group consisting of S, Se, Te, and combinations thereof, and x is a real number of 0 or more and less than 3.

The depositing of the resistance change layer may form a thin film on the substrate by supplying a precursor containing Bi, a halogen element precursor, a chalcogen element precursor, and heat together.

In the depositing of the resistance change layer, according to a composition ratio of a halogen element of the halogen element precursor and a chalcogen element of the chalcogen element precursor, a concentration gradient of the $BiX^1_3$ and the $Bi_2X^2_{(3-x)}$ may occur in the resistance change layer.

The fabricating method of the resistance access memory device may further include forming a polymer protective layer on the resistance change layer after the depositing of the resistance change layer.

The polymer protective layer may be coated by a method selected from the group consisting of spin coating, bar coating, nozzle printing, spray coating, slot die coating, gravure printing, inkjet printing, screen printing, electrohydrodynamic jet printing, electrospray, and combinations thereof.

A solvent used in the coating may include a material selected from the group consisting of chlorobenzene, pyridine, aniline, dimethylformamide, dimethylsulfoxide, dimethylacetamide, N-methylpyrrolidone, N-methyl-2-pyridine, branched alcohol with 3 to 6 carbon atoms, and combinations thereof.

The substrate may include a material selected from the group consisting of FTO, Si, $SiO_2$, SiC, Ga, SiGe, ITO, $Al_2O_3$, InAs, GaAs, InP, GaN, InGaAs, InAlAs, GaSb, AlSb, AlP, GaP and combinations thereof.

A storage device may include the resistance access memory device above.

Other features and aspects will be apparent from the following detailed description, the drawings, and the claims.

BRIEF DESCRIPTION OF THE DRAWINGS

(a) to (d) of FIG. 3 are cross-sectional views of a resistance change layer of the resistance access memory device according to an embodiment of the present disclosure.

(a) to (d) of FIG. 4 are rough surface diagrams of the resistance change layer of the resistance access memory device according to an embodiment of the present disclosure.

(a) to (d) of FIG. 5 are XRD graphs of the resistance access memory device according to an embodiment of the present disclosure.

(a) to (d) of FIG. 6 are V-I graphs of the resistance access memory device according to an embodiment of the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The terms "about", "substantially", and the like to be used in this specification are used as a numerical value or a value close to the numerical value when inherent manufacturing and material tolerances are presented in the stated meaning, and used to prevent an unscrupulous infringer from unfairly using disclosed contents in which precise or absolute numerical values are mentioned to help in the understanding of the present disclosure. Throughout this specification, the term "step to" or "step of" does not mean "step for".

Throughout this specification, the term "combinations thereof" included in the expression of the Markush form means one or more mixtures or combinations selected from the group consisting of components described in the expression of the Markush form, and means to include at least one selected from the group consisting of the components.

Hereinafter, a resistance access memory device and a fabricating method of the same according to the present disclosure will be described with reference to embodiments, Examples, and drawings. However, the present disclosure is not limited to these embodiments, Examples and drawings.

Figure 1:
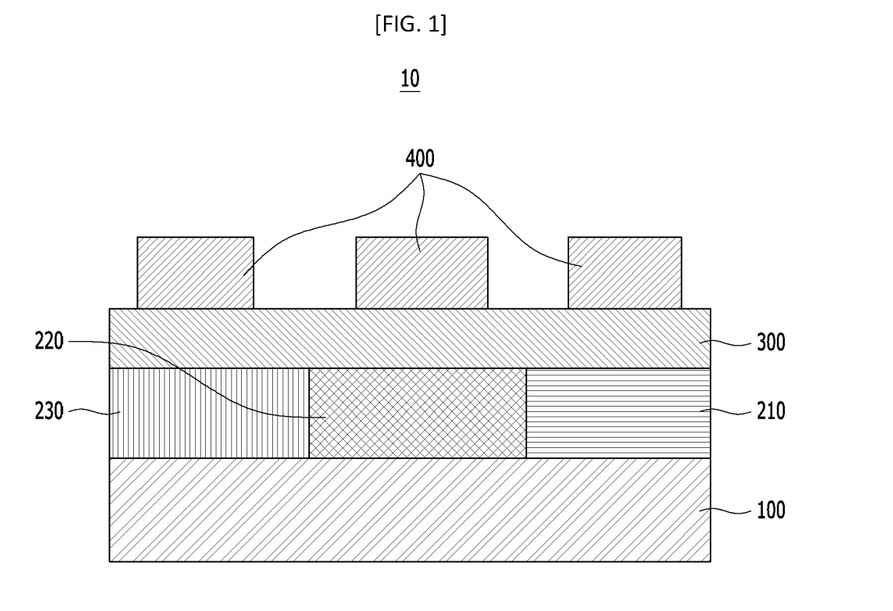
FIG. 1 is a schematic diagram of a resistance access memory device according to an embodiment of the present disclosure.

FIG. 1 is a conceptual diagram schematically illustrating a resistance access memory device according to an embodiment of the present disclosure.

As a technical means for achieving the present problem, a first aspect of the present disclosure provides a resistance access memory device 10, which includes a first electrode 100, a resistance change layer (not illustrated) formed on the first electrode 100, and a second electrode 400 formed on the resistance change layer, in which the resistance change layer includes a thin film containing $BiX^1_3$ (however, $X^1$ is a halogen element selected from the group consisting of F, Cl, Br, I, and combinations thereof) and $Bi_2X^2_{(3-x)}$ (however, $X^2$ is a chalcogen element selected from the group consisting of S, Se, Te, and combinations thereof and x is a real number of 0 or more and less than 3).

According to the present disclosure, the resistance access memory device may mean a device capable of inputting and/or outputting data through a resistance change. In this regard, according to a mechanism of changing the resistance of the resistance access memory device in the present disclosure, the resistance access memory device is classified into a resistance random access memory (ReRAM) device, a write once read many device (WORM device), an insulator device, etc.

In a general resistance access memory device, the physical principle of changing the resistance is to use the movement of atoms or ions in a material based on the external environment, instead of storing electrons in a specific space. Accordingly, the resistance access memory device may be more finely fabricated than the conventional memory device because a separate space to store electrons is not required, unlike the conventional memory device.

A resistance change layer used in the general resistance access memory device may include a material selected from the group consisting of oxide, hexagonal boron nitride, graphene, a transition metal chalcogenide compound, perovskite, and combinations thereof.

In the case of using a material of $APbX_3$ (in which, A is a monovalent organic ammonium ion or metal cation, and X is a halogen ion) as perovskite used in the resistance change layer used in the general resistance access memory device, there is an advantage capable of fabricating a resistance access memory device with low voltage and high efficiency. However, since the $APbX_3$ material uses lead (Pb), there is a disadvantage that there is a problem involved in the environmental contamination when fabricating or discarding.

To solve an environmental contamination problem caused by the $APbX_3$ material, the present disclosure provides a resistance access memory device including a resistance change layer containing bismuth halide represented by $BiX^1_3$ (however, $X^1$ is a halogen element selected from the group consisting of F, Cl, Br, I, and combinations thereof) and bismuth chalcogenide represented by $Bi_2X^2_{(3-x)}$ (however, $X^2$ is a chalcogen element selected from the group consisting of S, Se, Te, and combinations thereof and x is a real number of 0 or more and less than 3) instead of the $APbX_3$ material.

According to an embodiment of the present disclosure, the thin film may have a composition gradient of the $BiX^1_3$ component and the $Bi_2X^2_{(3-x)}$ component, but is not limited thereto.

According to an embodiment of the present disclosure, the thin film may include a first area 210 where the composition ratio of $BiX^1_3$ is more than 55 at %, a second area 220 where the composition ratio of $BiX^1_3$ is more than 12 at % and 55 at % or less, and a third area 230 where the composition ratio of $BiX^1_3$ is 12 at % or less, but is not limited thereto. For example, the first area 210 may have the composition ratio of $BiX^1_3$ of more than about 55 at %, about 60 at % or more, about 65 at % or more, about 70 at % or more, about 75 at % or more, about 80 at % or more or about 85 at % or more, but is not limited thereto. Further, for example, the second area 220 may have the composition ratio of $BiX^1_3$ of more than about 12 at % to about 55 at % or less, about 15 at % or more to about 55 at % or less, about 20 at % or more to about 55 at % or less, about 25 at % or more to about 55 at % or less, about 30 at % or more to about 55 at % or less, about 35 at % or more to about 55 at % or less, about 40 at % or more to about 55 at % or less, about 45 at % or more to about 55 at % or less, about 50 at % or more to about 55 at % or less, more than about 12 at % to about 15 at % or less, more than about 12 at % to about 20 at % or less, more than about 12 at % to about 25 at % or less, more than about 12 at % to about 30 at % or less, more than about 12 at % to about 35 at % or less, more than about 12 at % to about 40 at % or less, more than about 12 at % to about 45 at % or less, more than about 12 at % to about 50 at % or less, about 15 at % or more to about 50 at % or less, about 20 at % or more to about 45 at % or less, about 25 at % or more to about 40 at % or less, or about 30 at % or more to about 35 at % or less, but is not limited thereto.

In the thin film, as the composition ratio of $BiX^1_3$ increases, the resistance access memory device, including the thin film, may be a resistance access memory device in which an input/output is free.

According to an embodiment of the present disclosure, the resistance access memory device 10 may include a thin film where the first area 210, the second area 220, and the third area 230 are separated from each other, as the resistance change layer, but is not limited thereto.

On the thin film, the first region 210, the second region 220, and the third region 230 may be divided by the composition ratio of the $BiX^1_3$ component. Although described below, the composition ratio of the $BiX^1_3$ component may be continuously or discontinuously present.

According to an embodiment of the present disclosure, a current on/off ratio of the resistance access memory device 10, including the first area 210, may be $10^4$ to $10^{10}$, but is not limited thereto. Thus, for example, the current on/off ratio of the resistance access memory device 10, including the first area 210, may be about $10^4$ to about $10^{10}$, about $10^5$ to about $10^{10}$, about $10^6$ to about $10^{10}$, about $10^7$ to about $10^{10}$, about $10^8$ to about $10^{10}$, about $10^9$ to about $10^{10}$, about $10^4$ to about $10^9$, about $10^4$ to about $10^8$, about $10^4$ to about $10^7$, about $10^4$ to about $10^6$, about $10^4$ to about $10^5$, about $10^5$ to about $10^9$, about $10^6$ to about $10^8$, or about $10^7$, but is not limited thereto.

According to an embodiment of the present disclosure, a driving voltage range of the resistance access memory device 10, including the first area 210, may be −2.0 V to +2.0 V, but is not limited thereto.

The driving voltage range may mean a period between a voltage at which a set operation occurs and a voltage at which a reset operation occurs in the resistance access memory device. The set operation may mean that the resistance of the resistance access memory device is changed from a low resistance state (LRS) to a high resistance state (HRS), and the reset operation may mean that the resistance is changed from the high resistance state (HRS) to the low resistance state (LRS). For example, the driving voltage range of the resistance access memory device may be about −2.00 V to about +2.00 V, about −1.75 V to about +2.00 V, about −1.50 V to about +2.00 V, about −1.25 V to about +2.00 V, about −1.00 V to about +2.00 V, about −0.75 V to about +2.00 V, about −0.50 V to about +2.00 V, about −0.25 V to about +2.00 V, about − 2.00 V to about +0.25 V, about −2.00 V to about +0.50 V, about −2.00 V to about +0.75 V, about −2.00 V to about +1.00 V, about −2.00 V to about +1.25 V, about −2.00 V to about +1.50 V, about −2.00 V to about +1.75 V, bout-1.75 V to about +1.75 V, about −1.50 V to about +1.50 V, about −1.25 V to about +1.25 V, about −1.00 V to about +1.00 V, about −0.75 V to about +0.75 V, about −0.50 V to about +0.50 V, or about −0.25 V to about +0.25 V, but is not limited thereto.

In this regard, the current on/off ratio refers to a ratio of a maximum value and a minimum value of the current flowing in the first area 210 or the second area 220 in the driving voltage range.

In the driving voltage range, an operation of inputting data to the first area 210 or outputting the input data may be performed at least twice, and although described below, the inputtable number of the data in the first area 210 and the second area 220 is different from each other.

According to an embodiment of the present disclosure, the resistance access memory device 10, including the second area 220, may be write once read many (WORM), but is not limited thereto.

The WORM, according to the present disclosure, may mean that once-written data can not be deleted or modulated regardless of the authority; thus, attracting attention for security in various industries because forgery and modulation of the data are impossible.

The second area 220 may be initially a state in which the resistance is high and then be a state in which the data may be input while the resistance is lowered when the voltage is applied. In addition, when a voltage in a different direction from the voltage for the data input is applied to the second area 220 while the data is input, the input data may be read and output.

A ratio of a current $I_{on}$ flowing in the second area 220 after the data is stored and a current $I_{off}$ flowing in the second area 220 before the data is stored may have a value similar to the current on/off ratio of the first area 210. However, the resistance of the first area 210 is restored to an initial state in which the voltage has not been applied to perform the data input many times. However, since the second area 220 cannot correct or delete the input data when the data is input once, the resistance of the on/off state of the second area 220 may not have a great effect on the performance of the resistance access memory device unlike the current on/off ratio of the first area 210.

According to an embodiment of the present disclosure, in the first area 210 and the second area 220, the resistance may be changed by the movement of ions in the areas, but is not limited thereto.

Specifically, in the first area 210 and the second area 220, $X^1$ ions and $X^2$ ions move by a voltage applied to the areas (operation 1). Then the moving ions are connected to locally form a conductive zone in the areas so that the resistance of the first area 210 and the second area 220 is lowered (operation 2). Subsequently, when the Joule's heating by the voltage and the voltage in an opposite direction to the applied voltage are applied, the connected ions start to be dispersed (operation 3). The local conductive zone is removed so that the resistance of the first area 210 and the second area 220 may be increased again (operation 4). By repeating the process, the resistance access memory device 10 may read and write the data.

In this regard, in the thin film including the first area 210 and/or the second area 220, as the ratio of $Bi_2X^2_{(3-x)}$ ions is increased, the resistance of the thin film may not be restored to the resistance before operation 1, that is, the initial state in which any resistance is not applied to have the characteristic of the WORM.

According to an embodiment of the present disclosure, the resistance access memory device 10, including the third area 230, may be an insulator, but is not limited thereto.

Unlike the current flowing in the first area 210 and the current flowing in the second area 220, the current flowing in the third area 230 just increases in a gently curved shape according to the applied voltage, but the current flowing in the third area 230 does not show an aspect of suddenly increasing or decreasing a specific voltage before and after. Accordingly, the third area 230 corresponds to an insulator.

To sum up the above-described contents, the resistance access memory device needs to include the first area 210 and the second area 220 having the composition ratio of $BiX^1_3$ of 12 at % or more, so that the input/output of the data is possible.

According to an embodiment of the present disclosure, the resistance access memory device 10 may further include a polymer protective layer 300 formed on the resistance change layer, but is not limited thereto.

The polymer protective layer 300 may serve to protect the resistance change layer from external oxygen or moisture, but is not limited thereto.

According to an embodiment of the present disclosure, the polymer protective layer 300 may include a polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, polymethoxy polyethylene glycol methacrylate, poly 2-methoxyethyl glycidyl ether, and combinations thereof, but is not limited thereto.

According to an embodiment of the present disclosure, the first electrode 100 and the second electrode 400 may include each independently a material selected from the group consisting of Pt, Ti, Ag, Au, Ni, Zr, Ta, Zn, Nb, Cr, Co, Mn, Fe, Al, Mg, Si, W, Cu, lanthanum metals, nitrides thereof, oxides thereof, and combinations thereof, but is not limited thereto.

In this regard, the first electrode 100 and the second electrode 400 may activate at least one area of the first area 210, the second area 220, and the third area 230 of the resistance change layer. For example, the resistance access memory device 10 where the second electrode 400 is located on the first area 210 may function as a resistance random access memory (ReRAM) device, and the resistance access memory device 10 where the second electrode 400 is located on the first area 210 and the second area 220 may function as a ReRAM in some area and a WORM in some area.

Figure 2:
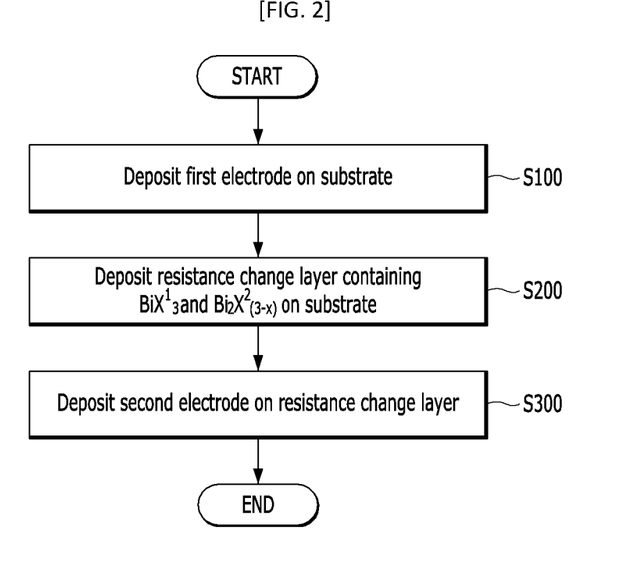
FIG. 2 is a flowchart illustrating a fabricating method of a resistance access memory device according to an embodiment of the present disclosure.

FIG. 2 is a flowchart illustrating a fabricating method of the resistance access memory device according to an embodiment of the present disclosure.

A second aspect of the present disclosure provides a fabricating method of the resistance access memory device 10, including the operations of depositing a first electrode 100 on a substrate, depositing a resistance change layer on the substrate, in which the resistance change layer contains $BiX^1_3$ (however, $X^1$ is a halogen element selected from the group consisting of F, Cl, Br, I, and combinations thereof) and $Bi_2X^2_{(3-x)}$ (however, $X^2$ is a chalcogen element selected from the group consisting of S, Se, Te, and combinations thereof and x is a real number of 0 or more and less than 3), and depositing a second electrode 400 on the resistance change layer.

With respect to the fabricating method of the resistance access memory device according to the second aspect of the present disclosure, the detailed description of the parts duplicated with the first aspect of the present disclosure was omitted, but even if the description thereof has been omitted, the contents described in the first aspect of the present disclosure may be applied to the second aspect of the present disclosure in the same manner.

First, the first electrode 100 is deposited on the substrate (S100).

According to an embodiment of the present disclosure, the substrate may include a material selected from the group consisting of FTO, ITO, Si, $SiO_2$, SiC, Ga, SiGe, $Al_2O_3$, InAs, GaAs, InP, GaN, InGaAs, InAlAs, GaSb, AlSb, AlP, GaP, and combinations thereof, but is not limited thereto.

Although described below, a method of depositing the first electrode 100 on the substrate may be a physical vapor deposition method, but is not limited thereto.

Subsequently, the resistance change layer is deposited on the substrate (S200), in which the resistance change layer contains $BiX^1_3$ (however, $X^1$ is a halogen element selected from the group consisting of F, Cl, Br, I, and combinations thereof) and $Bi_2X^2_{(3-x)}$ (however, $X^2$ is a chalcogen element selected from the group consisting of S, Se, Te, and combinations thereof and x is a real number of 0 or more and less than 3).

The resistance change layer may be deposited on the first electrode 100 deposited on the substrate, but is not limited thereto.

According to an embodiment of the present disclosure, the resistance change layer may include a thin film having a composition gradient of $BiX^1_3$ and $Bi_2X^2_{(3-x)}$, but is not limited thereto.

According to an embodiment of the present disclosure, the thin film may include a first area 210 where the composition ratio of $BiX^1_3$ is more than 55 at %, a second area 220 where the composition ratio of $BiX^1_3$ is more than 12 at % and 55 at % or less, and a third area 230 where the composition ratio of $BiX^1_3$ is 12 at % or less, but is not limited thereto.

In this regard, the resistance change layer may be separated into the first area 210, the second area 220, and the third area 230, according to the composition ratio of $BiX^1_3$.

According to an embodiment of the present disclosure, the composition ratio of $BiX^1_3$ may vary continuously or discontinuously, but is not limited thereto.

For example, the case where the composition ratio of $BiX^1_3$ continuously varies may mean that the first area 210, the second area 220, and the third area 230 are sequentially present on any one linear line in the resistance change layer. Further, the case where the composition ratio of $BiX^1_3$ discontinuously varies may mean that the first area 210, second area 220, and the third area 230 are mixed.

According to an embodiment of the present disclosure, the depositing of the resistance change layer may form the thin film on the substrate by supplying a precursor containing Bi, a halogen element precursor, a chalcogen element precursor, and heat together, but is not limited thereto.

According to an embodiment of the present disclosure, in the depositing of the resistance change layer, according to a composition ratio of a halogen element of the halogen element precursor and a chalcogen element of the chalcogen element precursor, a concentration gradient of $BiX^1_3$ and $Bi_2X^2_{(3-x)}$ may occur in the resistance change layer, but is not limited thereto.

Generally, a bismuth chalcogenide material such as $Bi_2X^2_{(3-x)}$ may be dissolved in an acidic solution to be spin-coated, but bismuth halide such as $BiX^1_3$ has a problem that is vulnerable to the acidic solution. Further, in a liquid process such as spin coating, since a concentration is evenly formed in all areas, it is difficult to form a concentration gradient through the liquid process.

Further, when a thin film having only the first area 210 and a thin film having only the second area 220 are fabricated and bonded to each other to make one device, there may be a problem that the thin film may be contaminated during the bonding process.

However, since bismuth chalcogenide and bismuth halide are vapor-deposited in the present disclosure, it is easy to adjust a composition ratio of bismuth halide by easily forming a concentration gradient of $BiX^1_3$ and $Bi_2X^2_{(3-x)}$ in the resistance change layer through a mask.

According to an embodiment of the present disclosure, after depositing the resistance change layer, the method may further include forming a polymer protective layer 300 on the resistance change layer, but is not limited thereto.

According to an embodiment of the present disclosure, the polymer protective layer 300 may be coated by a method selected from the group consisting of spin coating, bar coating, nozzle printing, spray coating, slot die coating, gravure printing, inkjet printing, screen printing, electrohydrodynamic jet printing, electrospray, and combinations thereof, but is not limited thereto.

Desirably, the polymer protective layer 300 may be formed by the spin coating.

The spin coating may mean a method of thinly coating a solution on a substrate by dropping or coating the solution onto the substrate, and then rotating the substrate at high speed. The spin coating is advantageous when a solution having a low viscosity is coated.

According to an embodiment of the present disclosure, a solvent used in the coating may include a material selected from the group consisting of chlorobenzene, pyridine, aniline, dimethylformamide, dimethylsulfoxide, dimethylacetamide, N-methylpyrrolidone, N-methyl-2-pyridine, branched alcohol with 3 to 6 carbon atoms, and combinations thereof, but is not limited thereto.

To sum up the contents, the polymer protective layer 300 may be formed by spin-coating the solvent, and a solution containing a material selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, polymethoxy polyethylene glycol methacrylate, poly 2-methoxyethyl glycidyl ether, and combinations thereof, but is not limited thereto.

Then, the second electrode is deposited on the resistance change layer (S300).

According to an embodiment of the present disclosure, the first electrode 100, the resistance change layer, and the second electrode 400 may be deposited by a physical vapor deposition method, but is not limited thereto. For example, the physical vapor deposition method may be a method selected from the group consisting of a thermal deposition method, a sputtering method, an electron beam deposition method, a pulsed laser deposition method, and combinations thereof, but is not limited thereto.

Desirably, the resistance change layer may be formed by the thermal deposition method. The first electrode 100 and the second electrode 400 may be formed by the sputtering, but are not limited thereto.

Further, a third aspect of the present disclosure provides a storage device including the resistance access memory device 10 according to the first aspect.

With respect to the storage device according to the third aspect of the present disclosure, the detailed description of the duplicated parts with the first aspect and the second aspect of the present disclosure has been omitted, but even if the description thereof has been omitted, the contents disclosed in the first aspect and the second aspect of the present disclosure may be applied to the third aspect of the present disclosure in the same manner.

According to an embodiment of the present disclosure, the storage device may include the first area 210 and/or the second area 220, but is not limited thereto.

The storage device including only the first area 210 corresponds to a device in which the input/output of the data is free like a general storage device, and the storage device including only the second area 220 may be used as a storage device used in industrial environments to prevent the forgery and modulation of the data.

Further, when the storage device includes the first area 210 and the second area 220 simultaneously, the storage device may include a data storage region where forgery and modulation are impossible and a data storage region that can be partially edited at the same time.

Hereinafter, the present disclosure will be described in more detail with reference to the following Examples, but the following Examples are only for illustrative purposes and are not intended to limit the scope of the present disclosure.

Example 1

A Si wafer substrate on which a Pt/Ti electrode was deposited was prepared. In addition, $BiI_3$ and $Bi_2S_3$ were thermally deposited on the substrate to form the thin film. Subsequently, on the thin film, a polymethyl methacrylate-chlorobenzene solution at a concentration of 2 mg/ml was applied and then spin-coated at a speed of 4,000 rpm to form a polymer protective layer. After the polymer protective layer was formed, 50 nm or more of silver was deposited on the polymer protective layer at a pressure of $10^{-6}$ Torr to form a silver electrode.

The thin film may include four points having different composition ratios of $BiI_3$ and $Bi_2S_3$, and composition gradients on the points are shown in Table 1 below.

TABLE 1

| Elements | Point 1 | | Point 2 | | Point 3 | | Point 4 | |
| --- | --- | --- | --- | --- | --- | --- | --- | --- |
| | wt % | at % | wt % | at % | wt % | at % | wt % | at % |
| C K | 4.42 | 26.37 | 5.49 | 27.15 | 8.46 | 32.34 | 10.37 | 34.10 |
| O K | 3.68 | 16.49 | 3.81 | 14.15 | 3.96 | 11.35 | 4.45 | 10.99 |
| Si K | 5.46 | 13.92 | 12.07 | 25.54 | 19.38 | 31.66 | 22.34 | 31.43 |
| S K | 1.47 | 3.27 | 2.75 | 5.10 | 4.80 | 6.87 | 9.06 | 11.17 |
| I L | 48.83 | 27.55 | 35.36 | 16.55 | 19.36 | 7.00 | 9.16 | 2.85 |
| Bi M | 36.14 | 12.38 | 40.52 | 11.52 | 42.55 | 9.34 | 43.02 | 8.13 |
| Ti K | — | — | — | — | 1.50 | 1.43 | 1.60 | 1.32 |
| Total | 100 | 100 | 100 | 100 | 100 | 100 | 100 | 100 |

In Points 1 to 4, the composition ratios of $Bib_3$ and $Bi_2S_{3-x}$ were 75:25 (Point 1), 55:45 (Point 2), 25:75 (Point 3), and 12:88 (Point 4), respectively.

In this regard, unlike Points 1 and 2, Points 3 and 4 are measured to a Ti element of the Pt/Ti electrode due to a low ratio of heavy elements (e.g., I in Table 1 above).

Figure 3:
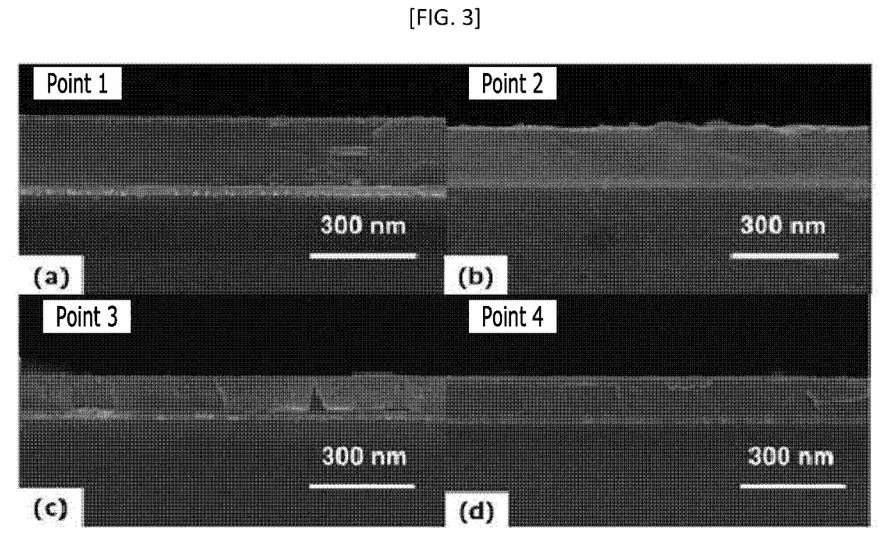
Figure 4:
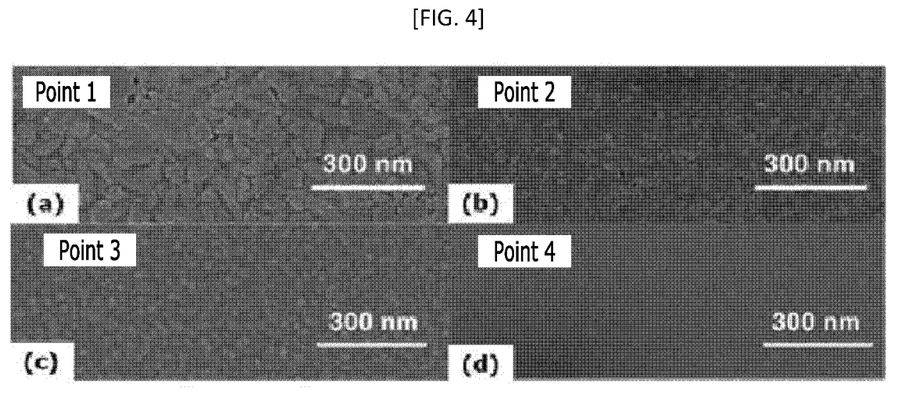
Figure 5:
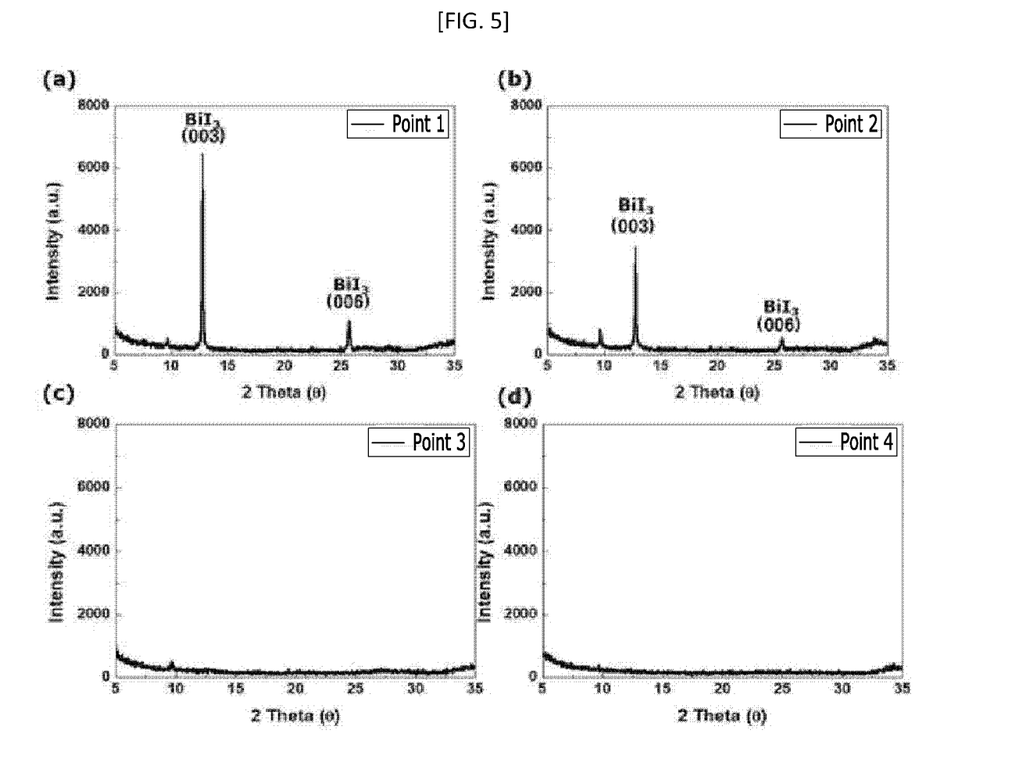

(a) to (d) of FIG. 3 are cross-sectional views of the resistance change layer of the resistance access memory device according to Example above, (a) to (d) of FIG. 4 are rough surface diagrams of the resistance change layer of the resistance access memory device according to Example above, and (a) to (d) of FIG. 5 are XRD graphs of the resistance access memory device according to Example above. In this regard, (a) to (d) of FIG. 3, (a) to (d) of FIG. 4, and (a) to (d) of FIG. 5 are sequentially referred to as Point 1 to Point 4.

Referring to FIG. 5, it can be confirmed that (003) peak and (006) peak of $BiI_3$ are gradually weakened as the composition ratio of $BiI_3$ is lowered, which means that the composition ratio of $Bi_2S_{3-x}$ is relatively increased.

Experimental Example 1

Figure 6:
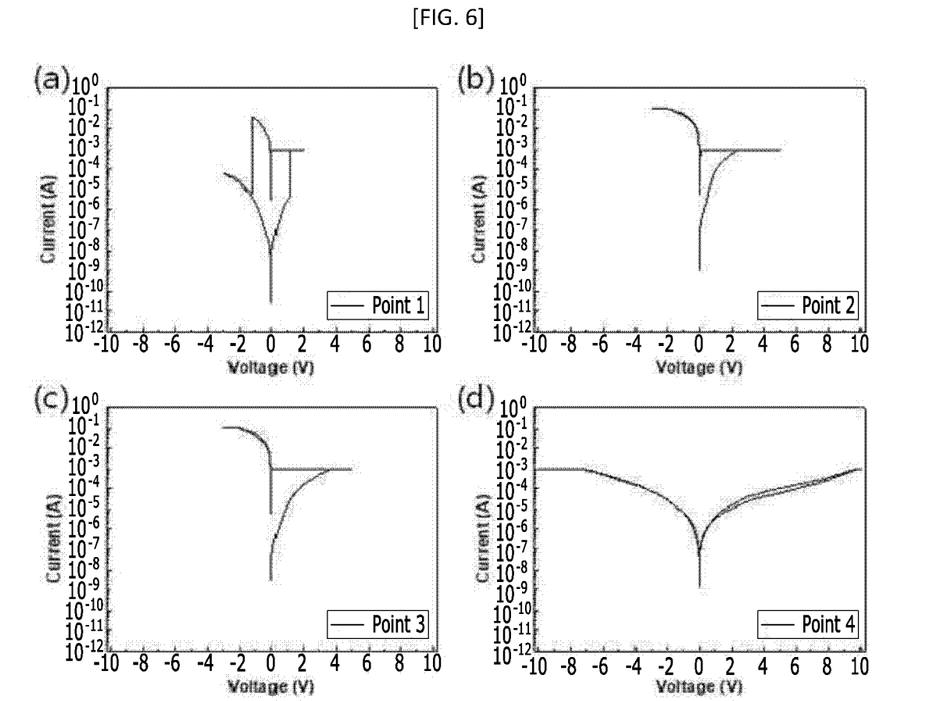

(a) to (d) of FIG. 6 are V-I graphs of the resistance access memory device according to the Example above. In this regard, FIGS. 6A to 6D are sequentially referred to as Point 1 to Point 4.

Referring to FIG. 6, when a voltage (initial state) of 0 V, a voltage of +2 V, a voltage (intermediate state) of 0 V, a voltage of −2 V, and a voltage of 0 V are sequentially applied to the resistance access memory device, the resistance of Point 1 may be restored to a value in the initial state, but the resistances of Points 2 and 3 are just values in an intermediate state, but are not restored to the value in the initial state like Point 1.

Further, in Point 4, the intensity of the current flowing in Point 4 is not rapidly increased based on a specific voltage.

Referring to FIG. 6, it may be confirmed that Point 1 functions as a general resistance change memory device, and Points 2 and 3 may function as WORM devices, and Point 4 corresponds to an insulator because a filament is not formed by voltage application.

Experimental Example 2

Figure 7:
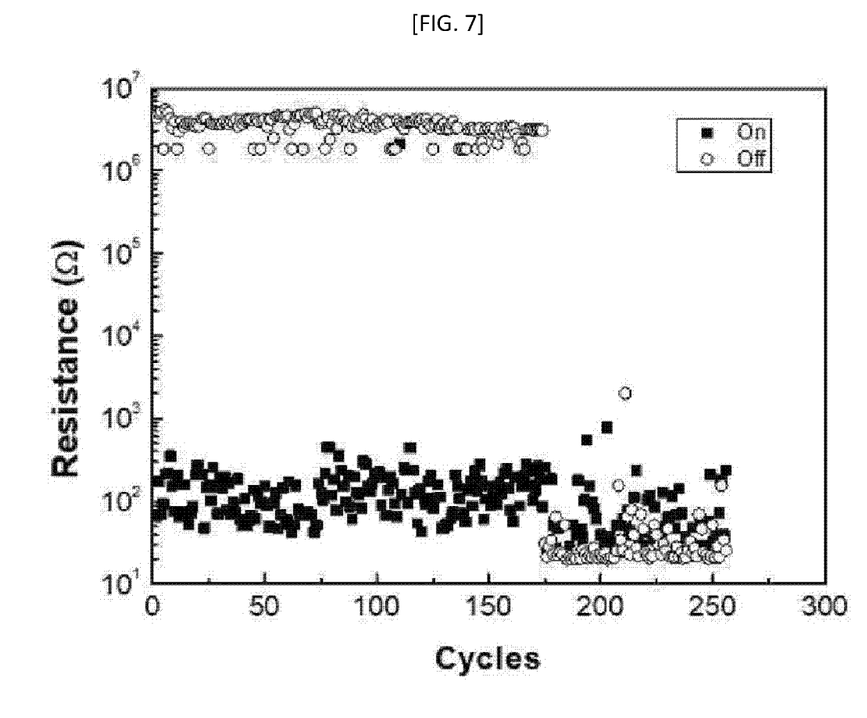
FIG. 7 is a graph showing a repeated driving characteristic of the resistance access memory device according to an embodiment of the present disclosure.
Figure 8:
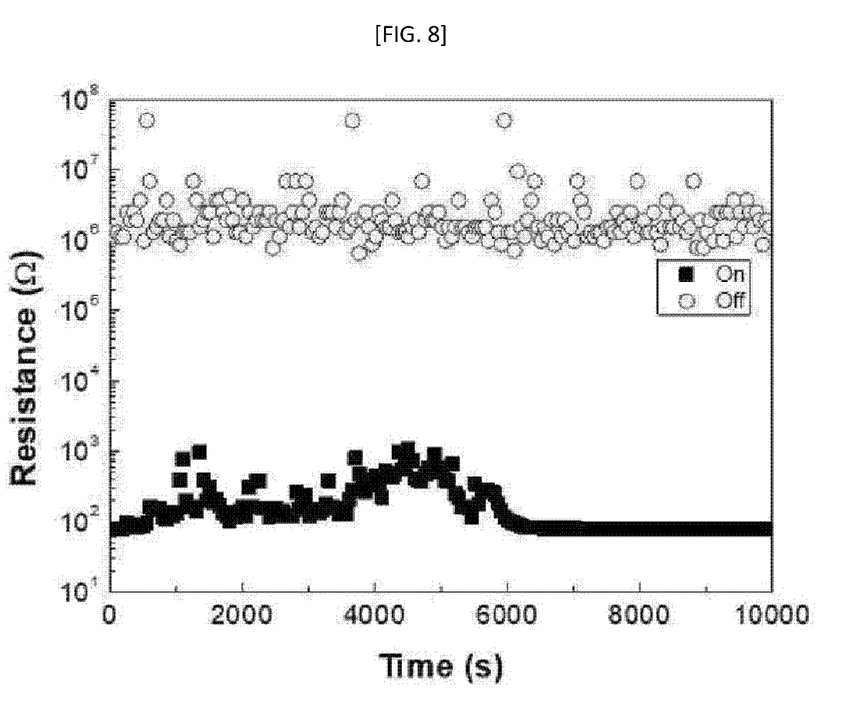
FIG. 8 is a graph showing a data retention characteristic of the resistance access memory device according to an embodiment of the present disclosure.

FIG. 7 is a graph showing a repeated driving characteristic of the resistance access memory device according to Example above, and FIG. 8 is a graph showing a data retention characteristic of the resistance access memory device according to Example above. In this regard, the graphs of FIGS. 7 and 8 are measured at the point of Point 1.

Referring to FIG. 7, in a region of Point 1, an on-state resistance and an off-state resistance may be uniformly maintained even if on and off operations of the voltage are performed about 170 times.

Referring to FIG. 8, in the region of Point 1, the data may be retained even when the on and off of the voltage are repeated for 10,000 sec or more.

According to the present disclosure, since the resistance access memory device does not include lead (Pd), it is possible to overcome an environmental problem.

Further, according to the present disclosure, the resistance access memory device adjusts a composition ratio of bismuth halide in the resistance change layer to exhibit all characteristics of a resistance change memory device, a write once read many (WORM) device, and/or an insulator device. Furthermore, the resistance access memory device is separated to provide a resistance change memory device, a write once read many (WORM) device, and/or an insulator device, respectively.

Further, according to the present disclosure, since the resistance access memory device has a resistance change layer based on bismuth halide and bismuth chalcogenide to have characteristics of low voltage and high efficiency.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A resistance access memory device comprising:
a first electrode;
a resistance change layer, formed on the first electrode, the resistance change layer comprising a thin film containing $BiX^1_3$ and $Bi_2X^2_{(3-x)}$; and
a second electrode formed on the resistance change layer,
wherein $X^1$ is a halogen element selected from the group consisting of F, Cl, Br, I, and combinations thereof, $X^2$ is a chalcogen element selected from the group consisting of S, Se, Te, and combinations thereof, and x is a real number of 0 or more and less than 3.

2. The resistance access memory device of claim 1, wherein the thin film has a composition gradient of the $BiX^1_3$ component and the $Bi_2X^2_{(3-x)}$ component.

3. The resistance access memory device of claim 2, wherein the thin film comprises a first area where a composition ratio of $BiX^1_3$ is more than 55 at %, a second area where the composition ratio of $BiX^1_3$ is more than 12 at % and 55 at % or less, and a third area where the composition ratio of $BiX^1_3$ is 12 at % or less.

4. The resistance access memory device of claim 3, wherein the first area, the second area, and the third area are separated from each other.

5. The resistance access memory device of claim 4, wherein a current on/off ratio of the resistance access memory device including the first area is $10^4$ to $10^{10}$.

6. The resistance access memory device of claim 4, wherein the resistance access memory device including the second area is write once read many (WORM).

7. The resistance access memory device of claim 1, further comprising:
a polymer protective layer formed on the resistance change layer.

8. The resistance access memory device of claim 7, wherein the polymer protective layer comprises a polymer selected from the group consisting of polymethyl methacrylate, polyethylene oxide, polypropylene oxide, polydimethylsiloxane, polyacrylonitrile, polyvinyl chloride, polyvinylidene fluoride, polyvinylidene fluoride-hexafluoropropylene, polyethyleneimine, polyphenylene terephthalamide, polymethoxy polyethylene glycol methacrylate, poly 2-methoxyethyl glycidyl ether, and combinations thereof.

9. The resistance access memory device of claim 1, wherein each of the first electrode and the second electrode comprises a material selected from the group consisting of Pt, Ti, Ag, Au, Ni, Zr, Ta, Zn, Nb, Cr, Co, Mn, Fe, Al, Mg, Si, W, Cu, lanthanum metals, nitrides thereof, oxides thereof, and combinations thereof.

10. A storage device comprising the resistance access memory device of claim 1.

11. A fabricating method of a resistance access memory device, comprising:
    depositing a first electrode on a substrate;
    depositing a resistance change layer on the substrate, the resistance change layer comprising $BiX^1_3$ and $Bi_2X^2_{(3-x)}$, wherein $X^1$ is a halogen element selected from the group consisting of F, Cl, Br, I, and combinations thereof, $X^2$ is a chalcogen element selected from the group consisting of S, Se, Te, and combinations thereof, and x is a real number of 0 or more and less than 3; and
    depositing a second electrode on the resistance change layer.

12. The fabricating method of the resistance access memory device of claim 11, wherein the depositing of the resistance change layer forms a thin film on the substrate by supplying a precursor containing Bi, a halogen element precursor, a chalcogen element precursor, and heat together.

13. The fabricating method of the resistance access memory device of claim 12, wherein in the depositing of the resistance change layer, according to a composition ratio of a halogen element of the halogen element precursor and a chalcogen element of the chalcogen element precursor, a concentration gradient of the $BiX^1_3$ and the $Bi_2X^2_{(3-x)}$ occurs in the resistance change layer.

14. The fabricating method of the resistance access memory device of claim 11, further comprising:
    forming a polymer protective layer on the resistance change layer after the depositing of the resistance change layer.

15. The fabricating method of the resistance access memory device of claim 14, wherein the polymer protective layer is coated by a method selected from the group consisting of spin coating, bar coating, nozzle printing, spray coating, slot die coating, gravure printing, inkjet printing, screen printing, electrohydrodynamic jet printing, electrospray, and combinations thereof.

16. The fabricating method of the resistance access memory device of claim 15, wherein a solvent used in the coating comprises a material selected from the group consisting of chlorobenzene, pyridine, aniline, dimethylformamide, dimethylsulfoxide, dimethylacetamide, N-methylpyrrolidone, N-methyl-2-pyridine, branched alcohol with 3 to 6 carbon atoms, and combinations thereof.

17. The fabricating method of the resistance access memory device of claim 11, wherein the substrate comprises a material selected from the group consisting of FTO, Si, $SiO_2$, SiC, Ga, SiGe, ITO, $Al_2O_3$, InAs, GaAs, InP, GaN, InGaAs, InAlAs, GaSb, AlSb, AlP, GaP and combinations thereof.

* * * * *